United States Patent
Patel

(10) Patent No.: US 10,707,897 B1
(45) Date of Patent: Jul. 7, 2020

(54) COMMAND PROCESSOR WITH MULTIPLE STRING COPY ENGINES FOR A DECOMPRESSION SYSTEM

(71) Applicant: ATI Technologies ULC, Markham (CA)

(72) Inventor: Vinay Patel, Stouffville (CA)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/560,998

(22) Filed: Sep. 4, 2019

(51) Int. Cl.
| | |
|---|---|
| *H03M 7/00* | (2006.01) |
| *H03M 7/30* | (2006.01) |
| *G06F 9/30* | (2018.01) |
| *G06F 40/12* | (2020.01) |
| *H03M 5/00* | (2006.01) |
| *H03M 7/40* | (2006.01) |

(52) U.S. Cl.
CPC ...... *H03M 7/3095* (2013.01); *G06F 9/30018* (2013.01); *G06F 40/12* (2020.01); *H03M 5/00* (2013.01); *H03M 7/00* (2013.01); *H03M 7/40* (2013.01)

(58) Field of Classification Search
CPC ............. H03M 5/00; H03M 7/00; H03M 7/40
USPC ..................................... 341/50, 51, 65, 67
See application file for complete search history.

(56) References Cited

U.S. PATENT DOCUMENTS 5,179,378 A * 1/1993 Ranganathan ...... H03M 7/3086
341/51

* cited by examiner

*Primary Examiner* — Joseph J Lauture
(74) *Attorney, Agent, or Firm* — Park, Vaughan, Fleming & Dowler LLP

(57) ABSTRACT

An electronic device for decompressing compressed data to recreate original data includes a first string copy engine and a second string copy engine. The first string copy engine processes a first string copy command by acquiring a first string from recreated original data and appending the first string to the recreated original data. The second string copy engine processes a second string copy command by checking the second string copy command for a dependency on the first string and, when the dependency is found, stalling further processing of the second string copy command until the first string copy engine has appended a corresponding portion of the first string to the recreated original data. The second string copy engine processes the second string copy command by acquiring a second string from the recreated original data and appending the second string to the recreated original data.

21 Claims, 6 Drawing Sheets

COMMAND PROCESSOR WITH MULTIPLE STRING COPY ENGINES FOR A DECOMPRESSION SYSTEM

BACKGROUND

Related Art

Some electronic devices perform operations for compressing data such as user or system files, flows or sequences of data, etc. The electronic devices may compress data to reduce the size of the data to enable more efficient storage of the data in memories, transmission of the data between electronic devices via a network, etc. For example, electronic devices can use a dictionary coding standard such as Lempel Ziv-77 (LZ77), LZ78, or Lempel-Ziv-Welch (LZW) for generating compressed data from original data.

Although compressing data can increase the efficiency of storing and handling data, compressed data must be decompressed before being used for many operations. This means that, before such operations can be performed, an electronic device must perform operations to reverse the effects of the compression operations—and thus to restore or recreate the original data. In many electronic devices, software (i.e., a software routine, an application program, etc.) is used for decompressing compressed data. Using software for decompressing compressed data typically requires a general-purpose processor such as a central processing unit (CPU) to perform a large number of decompression operations and associated memory accesses. Due to the large number of decompression operations and the memory accesses, using software for decompression is inefficient.

BRIEF DESCRIPTION OF THE FIGURES

Throughout the figures and the description, like reference numerals refer to the same figure elements.

DETAILED DESCRIPTION

Figure 1:
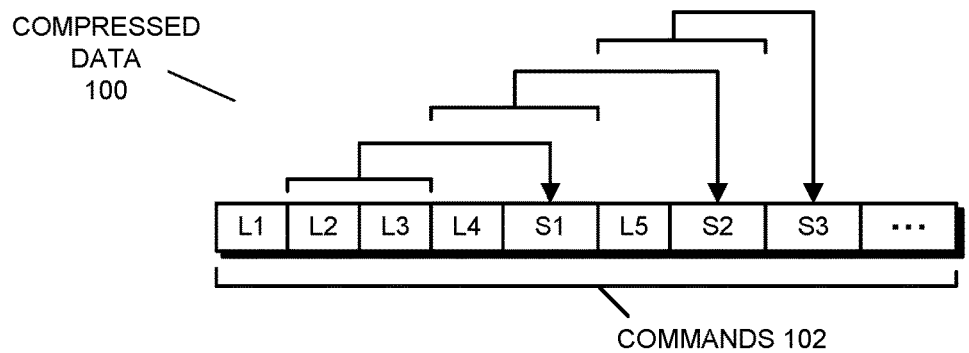
FIG. 1 presents a block diagram illustrating compressed data in accordance with some embodiments.

The following description is presented to enable any person skilled in the art to make and use the described embodiments and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that this term may have significant additional aspects that are not recited herein for clarity and brevity and thus the description is not intended to limit the term.

Functional block: functional block refers to a group, collection, and/or set of one or more interrelated circuit elements such as integrated circuit elements, discrete circuit elements, etc. The circuit elements are "interrelated" in that circuit elements share at least one property. For example, the interrelated circuit elements may be included in, fabricated on, or otherwise coupled to a particular integrated circuit chip or portion thereof, may be involved in the performance of given functions (computational or processing functions, memory functions, etc.), may be controlled by a common control element and/or a common clock, etc. A functional block can include any number of circuit elements, from a single circuit element (e.g., a single integrated circuit logic gate) to millions or billions of circuit elements (e.g., an integrated circuit memory).

Compressed Data

In the described embodiments, operations are performed on and using compressed data. Generally, compressed data is the output of one or more compression and/or other operations on original data that result in at least some of the original data being replaced by commands and/or other values that can be used to recreate the original data. In the described embodiments, various types of data may be compressed, including user or system files (e.g., audio and/or video files, document files, executable files, operating system files, etc.), flows or sequences of data (e.g., audio and/or video data flows, sequences of data received via a network interface, etc.), data captured from sensors (e.g., cameras and/or microphones, thermometers, vibration sensors, etc.), etc. In the described embodiments, numerous compression standards, algorithms, or formats, or combinations thereof, can be used for compressing data, including dictionary coding standards such as Lempel Ziv-77 (LZ77), LZ78, Lempel-Ziv-Welch (LZW), etc.

The terms "compressed data" and "compression" as used herein apply broadly to operations on original data that result in at least some of the original data being replaced by commands and/or other values that can be used to recreate the original data. As described above, these operations include various coding standards, algorithms, or formats, or combinations thereof. These terms should therefore not be interpreted as being limited only to operations such as dictionary coding compression and/or other operations that may sometimes be regarded as "compression" operations.

FIG. 1 presents a block diagram illustrating compressed data in accordance with some embodiments. As can be seen in FIG. 1, compressed data 100, which can be or be included in a file, a flow or sequence of data, etc., includes a set (i.e., series, sequence, etc.) of commands 102. Generally, each command of commands 102 includes, identifies, and/or refers to information that can be used to acquire and/or generate strings (i.e., of bits, characters, numbers, etc.), also called "symbols," that are to be appended to recreated original data during a decompression operation. In some embodiments, each command includes a set of bits that are organized to represent and/or identify the information that can be used to acquire and/or generate the strings for that command. In some embodiments, the information in commands refers to information outside the commands, e.g., information about separate sources from where command values are to be acquired, information to be used for computations associated with the commands, references to tables, records, or other data structures, etc.

Figure 2:
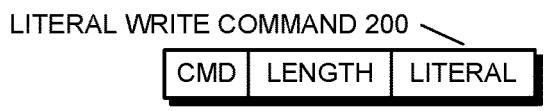
FIG. 2 presents a block diagram illustrating a literal write command in accordance with some embodiments.

In some embodiments, the commands include literal write commands and string copy commands. FIG. 2 presents a block diagram illustrating literal write command 200 in accordance with some embodiments. Literal write command 200 includes a command identifier (CMD) that, when processed in a decompression subsystem, causes the decompression subsystem to acquire a literal (LITERAL) of a specified length (LENGTH) (e.g., in bits, bytes, etc.) and append the literal to recreated original data. (Although shown as part of literal write command 200 in FIG. 2, in some embodiments, literals may be stored separately, such as in another portion or block of compressed data 100.) For the example in FIG. 1, the L1 literal write command causes a decompression subsystem to acquire a first one byte string, e.g., the character A, and append the first one byte string to recreated output data. "Append" as used herein indicates that a given string is added to the end of a sequence of previously recreated original data (that was recreated using commands that are not shown in FIG. 2) or is used as the initial string in new recreated data (when the command is the first command in compressed data). Continuing the example in FIG. 1, the L2-L5 literal write commands cause second through fifth one byte strings, e.g., the characters B, C, D, and E to be acquired and appended to the recreated original data in corresponding locations.

Figure 3:
FIG. 3 presents a block diagram illustrating a string copy command in accordance with some embodiments.

FIG. 3 presents a block diagram illustrating a string copy command 300 in accordance with some embodiments. String copy command 300 includes a command identifier (CMD) that, when processed in a decompression subsystem, causes the decompression subsystem to acquire a string of a specified length (LENGTH) (e.g., in bits, bytes, etc.) from a distance (DISTANCE) (e.g., in bits, bytes, etc.) back in previously recreated original data and append the data to recreated original data. Generally, string copy commands enable the decompression subsystem to copy strings of various lengths (perhaps from a minimum to a maximum string length) from earlier in previously recreated original data and add the copies of the strings to the end of recreated original data. For the example in FIG. 1, the S1 string copy command causes the decompression subsystem to copy the string that includes a combination of the literals appended to the recreated original data by literal write commands L2 and L3 three bytes back in the previously recreated original data, i.e., B and C, and append the copied string to the recreated original data (in a location following the literal appended to the recreated data by literal write command L4). Following the processing of the S1 string copy command, the recreated original data appears as follows: ABCDBC. The S2 string copy command causes the decompression subsystem to acquire a copy of a string that includes the L4 literal and the S1 string, i.e., DBC, and append the copy of the string to the recreated original data. Following the processing of the S2 string copy command, the recreated original data appears as follows: ABCDBCEDBC. The S3 String copy command causes the decompression subsystem to acquire a copy of a string that includes the L5 literal and S2 strings, i.e., EDBC, and append the copy of the string to the recreated original data. Following the processing of the S3 string copy command, the recreated original data appears as follows ABCDBCEDBCEDBC. As can be seen from the example in FIG. 1, both literals and previous strings, alone or in combination, can be copied and appended to recreated original data using string copy commands.

Although a particular sequence of commands is shown in compressed data 100, in some embodiments, different sequences and/or types of commands can be included in compressed data. Generally, compressed data 100 includes sufficient commands to enable the operations described herein. In addition, although various fields and information is shown as being included in literal write command 200 and string copy command 300, in some embodiments, literal write command 200 and string copy command 300 include different and/or differently arranged information. Generally, literal write command 200 and string copy command 300 include sufficient information to enable the operations described herein. Also, although one byte literals are used as an example in describing FIG. 1, in some embodiments, literals of other lengths can be used. For example, in some embodiments, literals are permitted to be up to two bytes. In addition, in some embodiments, minimum string lengths are used for string copy commands in accordance with the compression standards, algorithms, or formats, or combinations thereof and/or for other reasons. For example, in some embodiments, minimum string lengths are three bytes (and thus the shortest permitted string is three bytes).

In some embodiments, the string copy commands are permitted to copy strings from a "dictionary" that is defined by, and thus includes, a limited amount of recreated original data. In these embodiments, there is a limit as to how far back a string can be in the recreated original data before the string is no longer part of the dictionary for string copy commands. For example, in some embodiments, the dictionary includes a sliding window of 32 kB, 1 kB, or another amount of previously recreated original data. In other words, and assuming a 64 kB dictionary, even where more than 64 kB of previously recreated original data exists, only strings from within the most recently generated 64 kB of the recreated original data can be acquired for processing string copy commands.

In some embodiments, during a compression operation, an electronic device generates compressed data (e.g., compressed data 100) from original data by passing through original data in sections using a sliding window (e.g., a 32 kB sliding window) and determining a dictionary for each section that includes the data in that section. The electronic device then generates, as the compressed data for each section, a sequence of literal write commands, which append literal values of the unique strings to recreated original data, and/or string copy commands, which acquire copies of strings in previously recreated original data (i.e., the dictionary) and append the copies of the strings to the recreated original data. In some embodiments, and as described above, during a decompression operation, the commands are retrieved from the compressed data and used to recreate the original data using the same dictionary/sliding window/sections.

Overview

In the described embodiments, an electronic device includes a decompression subsystem functional block that performs operations for decompressing compressed data in order to recreate the original data from which the compressed data was generated. The decompression subsystem includes a command processor functional block that performs operations for processing commands such as literal write commands and string copy commands for recreating original data. The command processor includes two or more separate string copy engine functional blocks that enable the command processor to perform two or more string copy operations substantially in parallel (i.e., wholly or partially at the same time). The described embodiments can therefore efficiently generate strings when processing string copy commands for decompressing compressed data. Because string copy commands may copy strings from recreated original data that were appended to the recreated original data by previous string copy commands, dependencies may exist between two or more string copy commands being executed substantially in parallel in the two or more string copy engines. The command processor therefore also includes mechanisms for ensuring that dependencies between string copy commands are handled properly by the two or more separate string copy engines.

In the described embodiments, data is compressed using a dictionary coding standard (e.g., LZ77, LZ78, etc.), for which string copy operations can acquire copies of strings of longer than a specified minimum length from previously recreated original data and append the copies of the strings to the recreated original data. For example, string copy command S1 in FIG. 1 copies the string BC from previously recreated original data and appends the string to the recreated original data. In some embodiments, string copy operations are limited to a specified block or portion of previously recreated data, sometimes referred to as a "dictionary," for acquiring strings. For example, in some embodiments, a K-byte sliding window (e.g., 32 kB, 1 kB, etc.) is used as the dictionary, which means that strings can be copied only from as far back as K bytes in recreated original data. In some embodiments, the command processor includes mechanisms for locally storing copies of strings presently in the dictionary. These mechanisms include a scratch array and a history buffer, in which strings are stored in N-byte lines (e.g., 32 byte lines, 50 byte lines, etc.). The scratch array, which stores only a few (e.g., 4, 6, etc.) of the N-byte lines most recently written to recreated original data, is implemented using sequential logic storage elements (e.g., flip flops, latches, etc.) that are more directly coupled to the string copy engines. The string copy engines may therefore rapidly copy bytes from strings stored in the N-byte lines in the scratch array, e.g., in as little as a single cycle of a controlling clock. The history buffer, which stores the remainder of the N-byte lines (e.g., 1020, 1200, etc.), is implemented using memory elements (e.g., synchronous random access (SRAM) memory elements, dynamic random access memory (DRAM) elements, etc.). Copying strings from the N-byte lines in the history buffer is slower than copying strings from the scratch array (e.g., six cycles of the controlling clock), but is faster than using a remote memory such as a main memory in the electronic device for storing and copying the N-byte lines from the dictionary.

In some embodiments, during operation, as literal values from processing literal write commands or copied strings from processing string copy commands are appended to the recreated original data, the recreated original data flows or proceeds from the scratch array to the history buffer and then to the main memory for the electronic device. In other words, as a literal value or a string is appended to the recreated original data by the command processor, the command processor stores the individual bytes of the literal value or string into one or more N-byte lines in the scratch array. When the N-byte lines in the scratch array are full, the command processor moves (or "migrates") bytes of recreated original data from one or more N-byte lines in the scratch array in first-in-first-out order to available N-byte lines in the history buffer. Moving the lines from the scratch array frees the one or more N-byte lines in the scratch array for storing subsequent literal values or copied strings generated by the command processor. When the N-byte lines in the history buffer are full, the command processor moves (or "migrates") bytes of recreated original data from one or more N-byte lines in the history buffer in first-in-first-out order to the memory. This frees the one or more N-byte lines in the history buffer for storing bytes of the recreated original data received from the scratch array. In some embodiments, N-byte lines are immediately copied from the history buffer to the memory (and thus these embodiments do not wait for the history buffer to fill before writing the lines to memory), but are retained in the history buffer until overwritten by other N-byte lines when the history buffer fills with N-byte lines. These embodiments can avoid complications arising from memory system busyness or other delays in moving lines to the memory from the history buffer.

In some embodiments, as recreated original data flows or proceeds through the scratch array and history buffer to the memory, tracking mechanisms are used for keeping track of: (1) the number of N-byte lines that have been moved from the scratch array to the history buffer and (2) the bytes in the scratch array that presently store valid data. The tracking mechanisms include a line counter that stores a line count that indicates a number of N-byte lines of the recreated original data that have been moved from the scratch array to the history buffer. As each N-byte line is moved from the scratch array to the history buffer, the line counter increments the line count. The line count therefore indicates a total number of N-byte lines in the previously recreated original data that are presently stored in the history buffer and the memory. The tracking mechanisms also include a byte valid tracker that stores a set of byte valid indicators, with one of the byte valid indicators associated with each byte in the N-byte lines in the scratch array. As recreated original data is written to each byte in the scratch array, the command processor sets the corresponding byte valid indicator to indicate that valid recreated original data is present in the byte. As the recreated data is moved from the scratch array to the history buffer, the command processor clears the corresponding byte valid indicator to indicate that no valid recreated original data is present in the byte (and thus the byte is empty, invalid, etc.).

As described above, dependencies can occur between string copy commands. Generally, a dependency occurs because string copy commands can be executed substantially in parallel and thus a string copy command may copy strings appended to the recreated original data by earlier string copy commands and/or literal write commands that have not yet completed processing. A "direct" dependency occurs when a string copy command copies, from the recreated original data, strings that are appended to the recreated original data by an earlier string copy command. An "indirect" dependency occurs when a string copy command copies, from the recreated original data, strings that are appended to the recreated original data by literal write commands that are stalled while an earlier string copy command completes processing (and thus the string copy command is indirectly dependent on the earlier string copy command).

The above-described tracking mechanisms are used for ensuring that dependencies between string copy commands are properly handled. The string copy engines use the line count to quickly determine whether a string to be copied by a string copy command from a specified distance back in the recreated original data is present in the history buffer and/or the scratch array—and thus there is no as-yet unresolved dependency between the string copy command and a previous string copy command. The string copy engines also use the byte valid indicators in the byte valid array to ensure that dependencies are properly handled. More specifically, assuming that the line count indicates that the proper number of lines are present in the scratch array and history buffer, the string copy engines use the byte valid indicators to determine whether a string to be copied by a string copy command from the scratch array is present and ready to be copied from the scratch array.

By using the hardware decompression subsystem with the command processor that includes the string copy engines for processing two or more string copy commands substantially in parallel, the described embodiments efficiently and quickly perform decompression operations using hardware that existing devices perform using software. The decompression subsystem is faster and more efficient (e.g., requires less memory accesses, uses less electrical power, etc.) than using a software entity for performing the same operations. In addition, using the line count and byte valid indicators, the described embodiments are able to efficiently detect and handle dependencies between string copy commands, which enables the processing of string copy commands substantially in parallel in the string copy engines. Using the decompression subsystem frees other functional blocks (e.g., processing subsystems, etc.) in the electronic device to perform other operations. The decompression subsystem therefore improves the overall performance of the electronic device, which in turn improves user satisfaction.

Electronic Device

Figure 4:
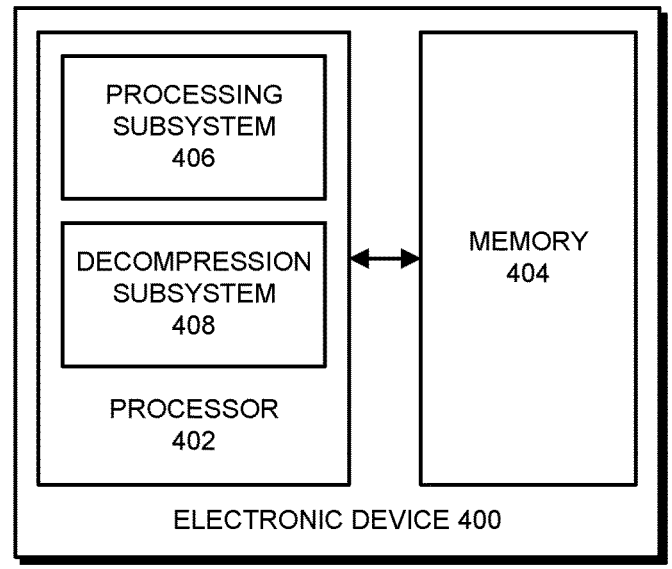
FIG. 4 presents a block diagram illustrating an electronic device in accordance with some embodiments.

FIG. 4 presents a block diagram illustrating electronic device 400 in accordance with some embodiments. As can be seen in FIG. 4, electronic device 400 includes processor 402 and memory 404. Processor 402 is a functional block that performs computational, decompression, and other operations in electronic device 400. Processor 402 includes processing subsystem 406 and decompression subsystem 408. Processing subsystem 406 includes one or more functional blocks such as central processing unit (CPU) cores, graphics processing unit (GPU) cores, embedded processors, and/or application specific integrated circuits (ASICs) that perform general purpose computational, decompression, and other operations.

Decompression subsystem 408 is a functional block that performs operations for decompressing compressed input data. Generally, decompression subsystem 408 takes, as input, compressed input data that was generated based on original data and returns, as output, strings (or symbols) such as sequences of one or more bits, characters, numbers, etc. for recreating the original data. Based on the arrangement of internal elements within decompression subsystem 408 (e.g., a number of separate string copy engines and/or command buffers in decompression subsystem 408), decompression subsystem 408 generates, from blocks of compressed data, up to a specified number of strings per time period (e.g., two strings per clock cycle, three strings every 333 ps, etc.). Decompression subsystem 408 is described in more detail below.

Memory 404 is a functional block that performs operations of a memory (e.g., a main memory) in electronic device 400. Memory 404 includes memory circuits (i.e., storage elements, access elements, etc.) for storing data and instructions for use by functional blocks in electronic device 400, as well as control circuits for handling accesses (e.g., reads, writes, checks, deletes, invalidates, etc.) of data and instructions in the memory circuits. The memory circuits in memory 404 include computer-readable memory circuits such as fourth-generation double data rate synchronous dynamic random access memory (DDR4 SDRAM), static random access memory (SRAM), or a combination thereof.

Electronic device 400 is shown using particular numbers and arrangements of elements (e.g., functional blocks and devices such as processor 402, memory 404, etc.). Electronic device 400, however, is simplified for illustrative purposes. In some embodiments, a different number or arrangement of elements is present in electronic device 400. For example, electronic device 400 may include power subsystems, displays, etc. Generally, electronic device 400 includes sufficient elements to perform the operations herein described.

Although decompression subsystem 408 is shown in FIG. 2 as being included in processor 402, in some embodiments, decompression subsystem 408 is a separate and/or stand-alone functional block. For example, decompression subsystem 408 might be implemented (by itself or with supporting circuit elements and functional blocks) on a standalone integrated circuit chip, etc. Generally, in the described embodiments, decompression subsystem 408 is suitably situated in electronic device 400 to enable performing the operations herein described.

Figure 5:
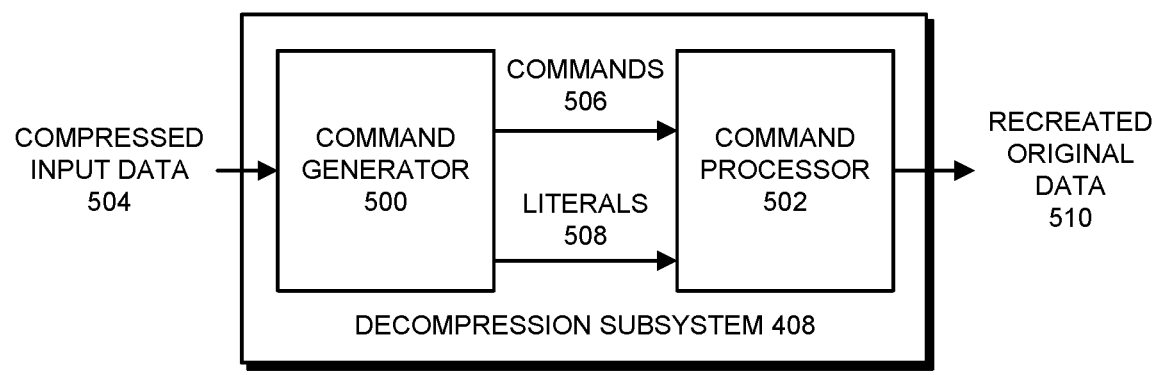
FIG. 5 presents a block diagram illustrating a decompression subsystem in accordance with some embodiments.

Electronic device 400 can be, or can be included in, any electronic device that performs data decompression or other operations. For example, electronic device 400 can be, or can be included in, electronic devices such as desktop computers, laptop computers, wearable electronic devices, tablet computers, smart phones, servers, artificial intelligence apparatuses, virtual or augmented reality equipment, network appliances, toys, audio-visual equipment, home appliances, controllers, vehicles, etc., and/or combinations thereof Decompression Subsystem In the described embodiments, a decompression subsystem in an electronic device performs operations for decompressing compressed input data, i.e., for recreating original data from which the compressed input data was generated. FIG. 5 presents a block diagram illustrating decompression subsystem 408 in accordance with some embodiments. As can be seen in FIG. 5, decompression subsystem 408 includes command generator 500 and command processor 502. Command generator 500 is functional block that performs operations for extracting commands 506 and literals 508 from compressed input data 504 and providing the commands 506 and literals 508 to command processor 502. Command processor 502 is a functional block that performs operations for processing commands 506 and literals 508 received from command generator 500 to generate corresponding strings, or symbols, of recreated original data 510 that are provided to a receiving entity (e.g., processing subsystem 406, memory 404, a networking subsystem, a sensor subsystem, etc.).

During operation, command generator 500 receives compressed input data 504 from a source entity (e.g., processing subsystem 406, memory 404, a networking subsystem, an 10 device, etc.). Compressed input data 504 is or includes a sequence or flow of bits with information for generating, acquiring, and/or retrieving commands 506 and literals 508. For example, in some embodiments, compressed input data 504 is arranged similarly to compressed data 100. Command generator 500 then performs operations for generating, acquiring, and/or retrieving the commands 506 and literals 508 from compressed input data 504. In other words, command generator 500 processes compressed input data 504 to extract commands 506 and literals 508 from compressed input data 504—or otherwise generates, acquires, or retrieves commands 506 and literals 508.

In some embodiments, for each literal write command or string copy command, command generator 500 finds a command identifier in compressed input data 504, such as in specified a set of bits in an initial position in compressed input data 504 or at the beginning of each command in compressed input data 504. Based on a type of command indicated by the command identifier, command generator 500 extracts the remaining information for the command from compressed input data 504. For example, for a literal write command (e.g., literal write command 200), in some embodiments, command processor 502 determines that the command identifier identifies the command as the literal write command (e.g., includes a specified arrangement of bits). Command processor 502 then extracts or acquires, from subsequent bits in compressed input data 504, the length of the literal and the string or symbol of the literal itself (which can be one or more bytes, up to a specified limit). Command generator 500 then communicates the command 506 and literal 508 (if any) to command processor 502, e.g., via one or more parallel or serial communication signal lines or routes. For example, assuming that the command is a string copy command 300, command generator 500 communicates, to command processor 502, an indication that the command is a string copy command, the distance back in recreated original data from where the string is to be copied (e.g., a number of bits or bytes, a number for calculating the number of bits or bytes, an offset, etc.), and a length of the string (e.g., a number of bits or bytes, a number for calculating the number of bits or bytes, an offset, etc.).

In some embodiments, command generator 500 computes or determines an address or location where the recreated original data provided by a literal write command or a string copy command is to be stored. For example, in some embodiments, command generator 500 keeps a running record of bytes of recreated original data that have been output by command processor 502 and uses the running record to determine an address or location where a first byte to be written by a given command is to be stored. In these embodiments, command generator 500 can tag or otherwise provide the address or location of the first byte to the command processor 502 for use thereby. For example, command generator 500 can provide an identifier of a particular byte, a number for calculating the particular bytes, an offset, etc. Command generator 502 can use the address or location for operations such as determining whether as-yet unresolved dependencies exist for a given string copy command, etc.

In some embodiments, command generator 500 performs other operations for generating, acquiring, and/or retrieving the commands 506 and literals 508 based on compressed input data 504 and/or other information. For example, in some embodiments, after being compressed using the dictionary coding standard, the compressed data is encoded using a coding standard such as a prefix coding standard (e.g., Huffman coding). In these embodiments, command generator 500 decodes compressed input data 504 prior to generating, acquiring, and/or retrieving the commands. Generally, command generator 500 can perform any number of operations for resolving commands 506 and literals 508 for communication to command processor 502.

Figure 6:
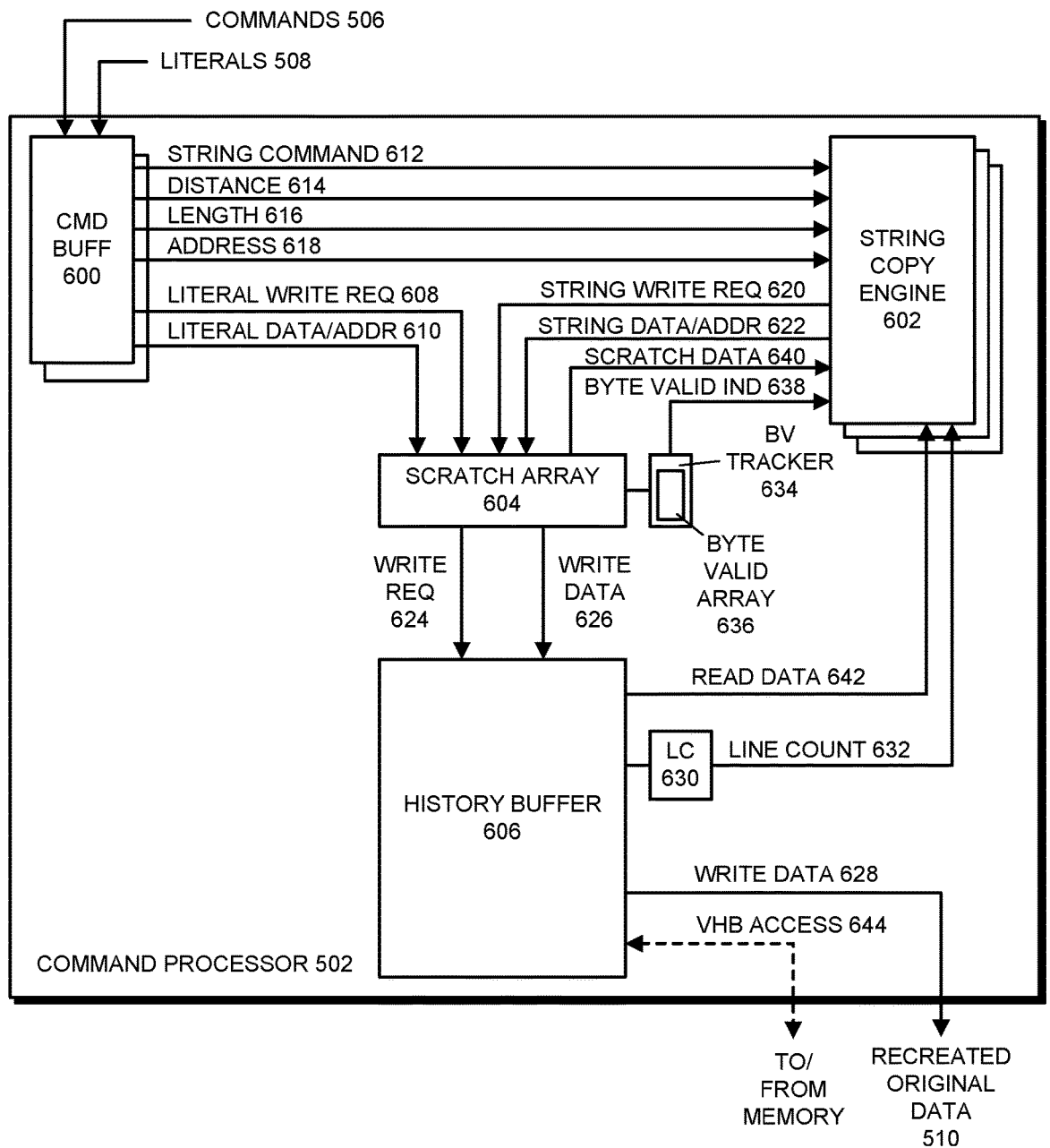
FIG. 6 presents a block diagram illustrating a command processor in accordance with some embodiments.

Upon receiving commands 506 and literals 508 from command generator 500, command processor 502 performs operations for processing commands 506 and literals 508. FIG. 6 presents a block diagram illustrating command processor 502 in accordance with some embodiments. As can be seen in FIG. 6, command processor 502 includes command buffer 600, multiple string copy engines 602, scratch array 604, and history buffer 606. Command buffer 600 is a functional block that performs operations for recognizing each command to be processed as a literal write command or a string copy command and either locally processing the command or forwarding the command to a string copy engine for processing therein. For example, command buffer 600 may receive a command-type signal or indicator via a dedicated signal line from command generator 500, via one or more bits on a serial or parallel signal line, etc., and determine whether the command is a literal write command or a string copy command based thereon.

When the command is a literal write command, in some embodiments, command buffer 600 locally processes the command (i.e., processes the command itself). For processing a literal write command, command buffer 600 generates, based on command 506 and literal 508 and the above-described running record of recreated original data, literal write request (REQ) 608. Command buffer 600 then forwards literal write request 608 along with literal data and address (DATA/ADDR) 610 to scratch array 604. Literal write request 608 is a signal, message, or other request that causes scratch array 604 to store the literal data (which, recall, may be one or more bytes) in bytes in recreated original data starting from a byte identified by the address (an absolute or relative address or byte position in the recreated original data).

Generally, "storing" the literal in the recreated original data starting from a byte identified by the address involves appending the literal to recreated original data that exists (or will exist) following the execution of commands prior to the literal write command. In other words, the literal is added to the end of the recreated original data as generated by previous commands. Note that, in some embodiments, some or all previous commands may still be being processed (in string copy engines 602, etc.), and thus the literal may be added to the recreated original data in a specified location (in storage elements in scratch array 604), while leaving other/ earlier locations free for storing literals or strings generated by the previous commands. In other words, the literal from the literal write command may be written to the recreated original data out of order, but in the proper location.

When the command is a string copy command, command buffer 600 forwards information for processing the string copy command to a string copy engine 602 for processing therein. For this operation, command buffer 600 selects the string copy engine 602 to which the string copy command is to be forwarded for processing from among the multiple string copy engines. For example, in some embodiments, command buffer 600 selects the string copy engines in a round robin pattern for processing separate string copy commands from sequences of string copy commands. As another example, in some embodiments, command buffer 600 selects the string copy engines as the string copy engines become available for processing separate string copy commands from sequences of string copy commands. In these embodiments, a given string copy engine may process two or more consecutive string copy commands substantially in parallel with another string copy engine that processes only one string copy command.

When forwarding the string copy command to the string copy engine 602, command buffer 600 forwards various separate items of information to be used for processing the string copy command. As can be seen in FIG. 6, the items of information include string command 612, distance 614, length 616, and address 618 to the selected string copy engine 602. String command 612 includes one or more bits that inform the string copy engine that a string copy command is awaiting processing (and thus causes the string copy engine to process the string copy command). In some embodiments, each string copy engine 602 has a separate string command 612 (e.g., is connected to a dedicated signal line, etc.) and thus command buffer 600 can forward a signal on the string command 612 to inform that particular string copy engine 602 that a string copy command is awaiting processing. Distance 614 is an identification of a number of bits, bytes, etc. back in previously recreated original data where a string that is to be copied is located. Length 616 is a representation of a length of the string to be copied in bits, bytes, etc. Address 618 identifies a location in recreated original data where the string is to be stored (an absolute or relative address or byte position in the recreated original data) that is computed by command generator 500 using the above-described running record of recreated original data. Based on the values received from command buffer 600, the string copy engine 602 generates string write request 620. The string copy engine 602 then forwards string write request 620 along with string data and address (DATA/ADDR) 622 to scratch array 604. String write request 620 is a signal, message, or other request that causes scratch array 604 to store the string (which, recall, may be one or more bytes) in bytes in recreated original data starting from a byte identified by the address.

Generally, "storing" the string in the recreated original data starting from a byte identified by the address involves appending the string to recreated original data that exists (or will exist) following the execution of commands prior to the string copy command. In other words, the string is added to the end of the recreated original data as generated by previous commands. Note that, in some embodiments, some or all previous commands may still be being processed (in string copy engines 602, etc.), and thus the string may be added to the recreated original data in a specified location (in storage elements in scratch array 604), while leaving other/earlier locations free for storing literals or strings generated by the previous commands. In other words, the string from the string copy command may be written to the recreated original data out of order, but in the proper location. An example of this can be seen in FIG. 7, which presents a block diagram illustrating a scratch array line 700 in accordance with some embodiments. For the example in FIG. 7, recreated original data (ROD) is written to the first and third of four locations (e.g., bytes) in a scratch array line 700, but the second location (EMPTY) has not yet been written—and thus the recreated original data in the third location has been "appended" to the recreated original data that will eventually be produced by previous commands.

Although not shown in FIG. 6, in some embodiments, there is a first-in-first-out buffer located between command buffer 600 and scratch array 604. In these embodiments, instead of forwarding literal write requests 608 and literal data and addresses 610 associated with literal write commands directly to scratch array 604, command buffer 600 writes literal write requests 608 and literal data and addresses 610 for these literal write commands to the first-in-first-out buffer. The values are held in the first-in-first-out buffer until the literal write request is to be processed, and then released to the scratch array. In these embodiments, instead of holding literal write commands while preceding commands (e.g., longer string copy commands, etc.) complete execution, command buffer 600 can forward literal write requests 608 and literal data and addresses 610 for these literal write commands to the first-in-first-out buffer and proceed with subsequent commands. For example, command buffer 600 can process and forward a subsequent string copy command to a string copy engine for processing therein. Although the subsequent string copy command may be stalled while the preceding command and the literal write command complete their writes of the scratch array, the string copy engine gets a chance to proceed with any history buffer reads that may be needed for processing the subsequent string copy command.

Scratch array 604 is a functional block that includes sequential logic storage elements (e.g., flip flops, latches, etc.) for storing literals or strings (or symbols) forwarded from command buffer 600 and the string copy engines 602. Scratch array 604 is faster-access storage in which a small number of N-byte (e.g., 32 byte, 60 byte, etc.) lines of recreated original data are stored to enable the string copy engines 602 to quickly access the strings stored therein when processing string copy commands. The sequential logic storage elements in scratch array 604 are located closely to the string copy engines 602 and are coupled to the string copy engines 602 by relatively direct signal routes. For example, in some embodiments, the sequential logic storage elements are proximal to or neighbor the string copy engines (or string copying functional blocks included in the string copy engines) in a semiconductor layout in which command processor is fabricated and are coupled to the circuits via relatively direct communication routes in the semiconductor layout.

The particular number of N-byte lines in scratch array 604 is selected to lead to a useful portion of recreated original data being quickly available to the string copy engines 602, without scratch array 604 being overlarge (i.e., requiring too much layout area), consuming too much electrical power, etc. For example, in some embodiments, a measured, estimated, or computed profile of a number of bytes to be copied by the string copy engines 602 is used (e.g., by a designer, etc.) to select the number of N-byte lines in scratch array 604. In some embodiments, scratch array 604 includes four, six, or another number of N-byte lines.

History buffer 606 is a functional block that includes memory elements (e.g., SRAM memory elements, DRAM memory elements, etc.) for storing literals and strings (or symbols) forwarded from command buffer 600 and the string copy engines 602. History buffer 606 is slower-access storage (relative to scratch array 604) in which a larger number of N-bye lines of recreated original data are stored to enable the string copy engines 602 to access the strings stored therein when processing string copy commands. In some embodiments, the number of N-byte lines included in history buffer 606 (and scratch array 604) is set based on a dictionary size of the dictionary coding standard used for generating compressed input data 504. For example, in these embodiments, assuming that the dictionary size is 32 kB, the N-byte lines are 32 bytes in size, and scratch array 604 has four 32 byte lines, the history buffer has storage for 1020 separate 32 byte lines (i.e., out of a total of 1024 32 byte lines in the dictionary). History buffer 606 typically has a much larger portion of the N-byte lines in the dictionary than scratch array 604.

During operation, in some embodiments, as literal values from processing literal write commands or copied strings from processing string copy commands are appended to the recreated original data, the recreated original data flows or proceeds from scratch array 604 to history buffer 606 and then to memory 404. In other words, as a literal value or a string is appended to the recreated original data by command buffer 600 or the string copy engines 602, respectively, scratch array 604 initially stores individual bytes of the literal value or string into one or more N-byte lines in scratch array 604. As literals and strings continue to be appended to the recreated original data, the N-byte lines in scratch array 604 eventually become full. When the N-byte lines become full, scratch array 604 moves bytes of recreated original data from one or more N-byte lines in scratch array 604 in first-in-first-out order to available N-byte lines in history buffer 606. In other words, scratch array 604 "migrates," via write request 624 and write data 626, older recreated original data from scratch array 604 to history buffer 606. Moving the bytes of the recreated original data from the N-byte lines from scratch array 604 in this way frees the one or more N-byte lines in scratch array 604 for storing subsequent literal values or copied strings generated by command buffer 600 or the string copy engines 602. When the N-byte lines in history buffer 606 become full with migrated recreated original data, history buffer 606 moves bytes of recreated original data from one or more N-byte lines in history buffer 606 in first-in-first-out order to memory 404. In other words, history buffer 606 "migrates," via write data 628, older recreated original data from history buffer 606 to memory 404. This frees the one or more N-byte lines in history buffer 606 for storing bytes of the recreated original data subsequently received/migrated from scratch array 604.

In some embodiments, history buffer 606 does not wait until history buffer 606 becomes full before writing N-byte lines to memory 404. In these embodiments, history buffer 606 copies N-byte lines to memory 404 as the N-byte lines are initially migrated to history buffer 606 from scratch array 604 (i.e., in a fashion similar to a write-through cache memory in an electronic device). The N-byte lines are, however, retained in history buffer 606 until sufficient subsequent N-byte lines have been written to history buffer 606 to overwrite the N-byte lines. In other words, even though copies of the N-byte lines are stored in memory 404, the N-byte lines remain in history buffer 606—and can be used as described herein—until overwritten by subsequent data. In these embodiments, issues with writing the N-byte lines back to memory at the moment that history buffer 606 fills up (e.g., memory system busyness, etc.) can be avoided.

In some embodiments, N-byte lines of recreated original data that are generated based on literal write commands and string copy commands nearer to the end of compressed data that would not otherwise be pushed out of the scratch array and/or history buffer by subsequent recreated original data are handled using one or more end-of-data mechanisms. Generally, the one or more end-of-data mechanisms ensure that that all of the recreated original data ends up stored in memory 404—and does not get stuck in scratch array 604 and/or history buffer 606. For example, in some embodiments, recreated original data flows or proceeds through scratch array 604 and history buffer 606 based on an age or lifetime of the recreated original data in scratch array 604 and/or history buffer 606. In these embodiments, as data reaches a given age or lifetime, scratch array 604 and/or history buffer 606 automatically migrate the data to history buffer 606 and memory 404, respectively. As another example, in some embodiments, the compressed data includes, at or near the end of the compressed data (e.g., as a last character, command, symbol, etc.) an "end of data" (or "end of file," etc.) character, command, symbol, etc. The end of data character, command, symbol, etc. causes the command processor to trigger scratch array 604 and/or history buffer 606 to automatically migrate the data to history buffer 606 and memory 404, respectively. In this way, recreated original data will eventually flow or proceed to memory 404, despite being located at the end of compressed data.

In some embodiments, scratch array 604 and history buffer 606 include mechanisms that enable the determination of information about previously recreated original data. These mechanisms keep track of information about and associated with recreated original data that has been generated as previous literal write commands and string copy commands were processed. In some embodiments, the mechanisms include line counter 630 and byte valid (BV) tracker 634. Line counter 630 is a functional block that performs operations for maintaining line count 632, which indicates a number of N-byte lines that have (up to a present time) been migrated from scratch array 604 to history buffer 606 while processing literal write commands and string copy commands. As each N-byte line is moved/migrated from scratch array 604 to history buffer 606, line counter 630 increments line count 632. Line count 632 therefore indicates a total number of N-byte lines of the previously recreated original data that are currently stored in history buffer 606 and memory 404 (and/or provided to another entity, such as processing subsystem 406, a network interface, a sensor, etc.). In some embodiments, line count 632 is stored in a memory element that is coupled to the string copy engines 602 by relatively direct signal routes and thus can be quickly accessed by the string copy engines 602.

Figure 7:
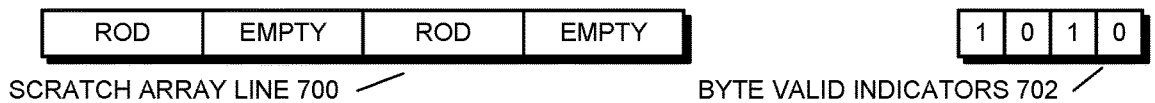
FIG. 7 presents a block diagram illustrating a line from a scratch array and corresponding byte valid indicators in accordance with some embodiments.

Byte valid tracker 634 is a functional block that performs operations for maintaining a set of byte valid indicators (IND) 638 in byte valid array 636. A separate byte valid indicator 638 in byte valid array 636 is associated with each byte in the N-byte lines in scratch array 604. As recreated original data is written to each byte in scratch array 604, byte valid tracker 634 sets the corresponding byte valid indicator 638 to indicate that valid recreated original data is present in the byte. As bytes of recreated data are moved/migrated from scratch array 604 to history buffer 606 (or bytes in scratch array 604 are initialized, cleared, invalidated, etc.), byte valid tracker 634 clears the corresponding byte valid indicator 638 to indicate that no valid recreated original data is present in the byte. An example of byte valid indicators 638 is presented in FIG. 7. As can be seen in FIG. 7, scratch array line 700, which is an example of an N-byte line from scratch array 604, has valid data in first and third bytes. The corresponding (i.e., first and third) byte valid indicators 638 in byte valid indicators 702, which is an example of byte valid indicators 638 from byte valid array 636, are set to 1 indicate that the data is valid in these bytes—and otherwise set to 0. In some embodiments, byte valid array 634 is located closely to the string copy engines 602 and the individual byte valid indicators 638 are coupled to the string copy engines 602 by relatively direct signal routes. The string copy engines 602 can therefore quickly access the byte valid indicators 638 to determine whether the associated bytes contain valid recreated original data.

As described above, dependencies (or, rather, as-yet unresolved dependencies) can occur between string copy commands. A direct dependency occurs when a string copy command copies, from the recreated original data, strings that are appended to the recreated original data by an earlier string copy command. An indirect dependency occurs when a string copy command copies, from the recreated original data, strings that are appended to the recreated original data by literal write commands that are stalled while an earlier string copy command completes processing (and thus the string copy command is indirectly dependent on the earlier string copy command).

The string copy engines 602 use line count 632 and byte valid array 636 for ensuring that dependencies between string copy commands are handled properly. The string copy engines 602 use line count 632 to determine whether a string to be copied by a string copy command from a specified distance back in the recreated original data is present in scratch array 604 and/or history buffer 606 (recall that parts of the same multi-byte string may be stored in N-byte lines in scratch array 604 and history buffer 606). For example, a string copy engine 602 may compare the relative values of the distance from a string copy command with line count 632 and determine that an as yet unresolved dependency exists when the difference is larger than a threshold. For instance, assuming that scratch array 604 holds four N-byte lines, if line count 632 indicates that four N-byte lines are present in history buffer 606, the maximum number of full N-byte lines present in scratch array 604 and history buffer 606 is eight (recall, however, that some of the N-byte lines in scratch array 604 may not yet hold valid data due to an in-progress string copy command and/or literal write commands subsequent thereto). In this case, when a string copy command copies data from a tenth N-byte line, and thus the difference between the distance and line count 632 is two—and is larger than a threshold of zero—the string copy engine 602 determines that an unresolved dependency exists. In other words, because a previous string copy command and/or literal write command has/have not completed processing, a smaller number of N-byte lines have been added to the recreated original data in scratch array 604 and/or history buffer 606 than is necessary to enable copying some or all of the string for the string copy command from the recreated original data. In this case, processing of the previous string copy command and/or one or more literal write commands should complete before the string copy engine 602 proceeds with processing the string copy command. The string copy engine 602 therefore temporarily stalls the processing of the string copy command to allow processing of the previous string copy command and/or the one or more literal write commands to complete before the string copy engine 602 proceeds with processing the string copy command.

The string copy engines 602 use byte valid indicators 638 to determine whether a string to be copied by a string copy command from scratch array 604 is present and ready to be copied from scratch array 604. In other words, it is possible that a previous string copy command and/or literal write command have not yet written the necessary recreated original data to scratch array 604 and thus particular bytes in scratch array 604 are as yet invalid. The string copy engine 602 therefore checks whether the byte valid indicators indicate that the necessary data is present in bytes of N-byte line(s) in scratch array 604. If the data is not yet present, the string copy engine 602 temporarily stalls the processing of the string copy command to allow processing of the previous string copy command and/or the one or more literal write commands to complete before the string copy engine 602 proceeds with processing the string copy command.

In some embodiments, above-described the checks of line count 632 and byte valid indicators 638 are done as a pair, with one following the other as needed. In these embodiments, when processing a string copy command, a string copy engine 602 checks line count 632 as described above to ensure that a given N-byte line is in scratch array 604 (again, the N-byte line may not yet be fully written, due to an in-progress string copy command and/or literal write commands subsequent thereto). Then, if line count 632 indicates that the given N-byte line is present in scratch array 604, the string copy engine 602 checks the byte valid indicators 638 to ensure that the particular bytes of the N-byte line are present in scratch array 604. If either of these checks fail (i.e., show that the N-byte line is not present in scratch array 604 or the particular bytes are not yet present in scratch array 604), the string copy engine 602 temporarily stalls the processing of the string copy command to allow processing of the previous string copy command and/or the one or more literal write commands to complete before the string copy engine 602 proceeds with processing the string copy command.

After a string copy engine 602 has ensured that no as-yet unresolved dependency prevents a string copy command from being processed, the string copy engine 602 processes the string copy command. Generally, processing the string copy command involves acquiring a string (i.e., one or more bytes) of previously recreated original data from scratch array 604 and/or history buffer 606 and appending the string to the recreated original data. For acquiring the string, the string copy engine 602 uses distance 614 to determine a location in scratch array 604 or history buffer 606 where the string copy is to start (e.g., a first byte to be read). The string copy engine 602 also uses length 616 to determine a number of bytes of recreated original data to be read from the scratch array 604 and/or the history buffer 606. Starting from the location in the scratch array 604 or history buffer 606, the string copy engine 602 then reads the number of bytes of the recreated original data in sequence from the scratch array and/or the history buffer, e.g., via scratch data 640 and read data 642. For the read operation, the string copy engine 602 can directly read the sequential logic storage elements in scratch array 604, but performs typical memory read operations for reading the memory elements in history buffer 606 (e.g., SRAM memory read operations when history buffer 606 is implemented using SRAM, etc.). For appending the string to the recreated original data, the string copy engine 602 writes the string (i.e., the bytes of recreated original data read from scratch array 604 and history buffer 606) to locations in scratch array 604 and/or history buffer 606 as identified by address 618. Note that separate parts of a sufficiently long multi-byte string may be stored in scratch array 604 and history buffer 606, and thus parts of the string can be read from and written to the scratch array 604 and history buffer 606 as described above (i.e., data may be migrated from scratch array 604 to history buffer 606 to make room in scratch array 604 for longer strings).

Although a specific number and arrangement of functional blocks is presented in decompression subsystem 408 and command processor 502 in FIGS. 5-7, in some embodiments, different numbers and/or arrangements of functional blocks are present in decompression subsystem 408 and/or command processor 502. For example, in some embodiments, command processor 502 includes two or more command buffers and/or three or more string copy engines—as shown using the multiple blocks in FIG. 5. As another example, in some embodiments, history buffer 606 is "virtualized," and at least some of the recreated original data described above as being stored in history buffer 606 is instead stored in memory 404. In these embodiments, writing recreated original data to and reading previously recreated original data from at least some part of history buffer 606 involves performing a virtual history buffer access 644 in memory 404. Note that virtualizing history buffer 606 means that history buffer 606 requires less memory elements, and so history buffer 606 can be smaller in terms of layout size, use less electrical power, etc., albeit with an access time increase for recreated original data stored in memory 404.

Process for Decompressing Compressed Input Data

Figure 8:
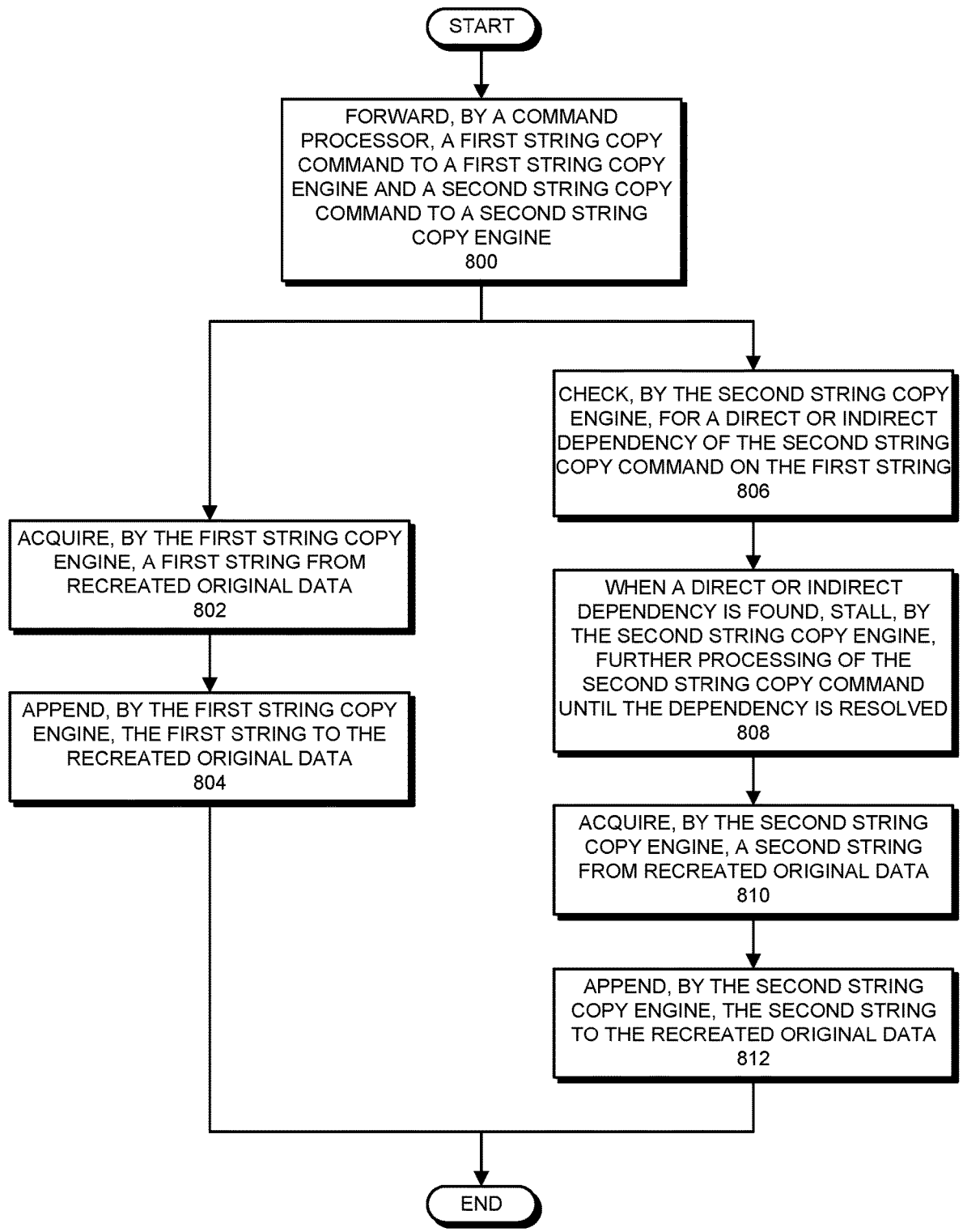
FIG. 8 presents a flowchart illustrating a process for decompressing compressed input data in accordance with some embodiments.

In the described embodiments, a decompression subsystem (e.g., decompression subsystem 408) that includes a command generator and a command processor (e.g., command generator 500 and command processor 502) performs operations for decompressing compressed input data (e.g., compressed input data 504) to generate recreated original data (e.g., recreated original data 510). FIG. 8 presents a flowchart illustrating a process for decompressing compressed input data in accordance with some embodiments. Note that the operations shown in FIG. 8 are presented as a general example of operations performed by some embodiments. The operations performed by other embodiments include different operations, operations that are performed in a different order, and/or operations that are performed by different entities or functional blocks.

For the process shown in FIG. 8, it is assumed that the decompression subsystem receives compressed input data from a source such as a file, a stream of data, etc. In other words, the individual bits of the compressed input data are being received by the decompression subsystem and thus are available to be operated on by the command generator and the command processor in the decompression subsystem. In some embodiments, the decompression subsystem simply (and possibly only) decompresses compressed input data that is provided to the decompression subsystem by another entity (e.g., a processing subsystem, a memory) to generate strings for recreating the original data from which the compressed input data was created. In other words, in these embodiments, the decompression subsystem does not perform operations other than outputting recreated original data that was generated from the compressed input data provided to the decompression subsystem. In some embodiments, however, the decompression subsystem includes functional blocks for performing other operations, such as retrieving data from memory and/or other locations or entities (e.g., the processing subsystem, network interfaces, IO devices, etc.), for storing strings of recreated original data in memory and/or providing the strings of recreated original data to other entities, etc.

For the example in FIG. 8, a first string copy engine and a second string copy engine perform certain operations "substantially in parallel," in that these operations are performed at approximately the same time. This can be seen in FIG. 8 as the parallel branches of the flowchart (i.e., the branch that includes steps 802-804 and the branch that includes steps 806-812). These operations are performed at approximately the same time, in that the operations are commenced at or near a same time—e.g., in back to back cycles of a controlling clock in an embodiment with only one command buffer (e.g., command buffer 600), in the same clock cycle in an embodiment with two or more command buffers, etc. In addition, although not shown in FIG. 8, the first string copy engine initially checks for as-yet unresolved dependencies for the first string copy command with previous string copy commands (dependency checks are described in more detail with respect to FIG. 10). For the example in FIG. 8, it is assumed that no as-yet unresolved dependency is found, and thus the first string copy engine proceeds with processing the first string copy command.

As can be seen in FIG. 8, the process starts when the command processor forwards a first string copy command to a first string copy engine and forwards a second string copy command to a second string copy engine (step 800). For this operation, one or more command buffers in the command processor (e.g., command buffer 600) receive, from a command generator (e.g., command generator 500), information (e.g., distance 614, length 616, and address 618) for processing each of the first and second string copy commands. The one or more command buffers then forward appropriate information to the first string copy engine for processing the first string copy command and second string copy engine for processing the second string copy command.

Upon receiving the first string copy command, the first string copy engine acquires a first string from the recreated original data (step 802). For this operation the first string copy engine determines, based on the distance, a location in a scratch array (e.g., scratch array 604) or a history buffer (e.g., history buffer 606) from where the first string is to be read, and thus particular recreated original data that is to be acquired for the first string. For example, the first string copy engine may compute, using the distance, a particular byte in an N-byte line in the scratch array or the history buffer from where reading the first string is to commence. The first string copy engine then, based on a length of the string, reads one or more bytes for the first string in sequence from the scratch array and/or the history buffer starting from the location in the scratch array or history buffer. At the conclusion of this operation, the first string copy engine has a copy of the one or more bytes of the first string.

The first string copy engine then appends the first string to the recreated original data (step 804). For this operation, the first string copy engine writes the individual bytes of the first string, which is recreated original data, to locations in the scratch array starting from location in the scratch array indicated by the address. Note that one or more previous string copy commands and/or literal write commands may not have completed their respective writes to the scratch array and thus the first string copy command may write data to bytes in the scratch array that are past the current end of the recreated original data in the scratch array. It can happen, however, that the first string copy engine simply adds the recreated original data to the end of existing recreated original data for the appending operation. In addition, when the first string is sufficiently long and/or the scratch array is already sufficiently full of previously recreated original data, the scratch array may migrate recreated original data to the history buffer in first-in-first-out order to free up one or more N-byte lines for the first string copy engine to continue to write recreated original data to the scratch array.

Upon receiving the second string copy command, the second string copy engine checks for a direct or indirect dependency of the second string copy command on the first string (step 806). As described above, an as-yet unresolved direct or indirect dependency can arise because the first string copy command and the second string copy command are executed substantially in parallel and the first string copy command has not yet written recreated original data to the scratch array and/or data has not been migrated from the scratch array to the history buffer that is to be copied for the second string. For this operation, the second string copy engine checks for these as-yet unresolved dependencies (dependency checks are described in more detail with respect to FIG. 10). When a direct or indirect dependency (i.e., an as-yet unresolved dependency) is found, the second string copy engine stalls further processing of the second string copy command until the dependency is resolved (step 808). For this operation, the second string copy engine halts or otherwise delays processing the second string copy command until the first string copy command has written the portion of the first string that is needed for the second string into the scratch array and/or the history buffer.

The second string copy engine then acquires the second string from the recreated original data (step 810). For this operation (or for the earlier determination of dependency), the second string copy engine determines, based on the distance, a location in the scratch array or the history buffer from where the second string is to be read, and thus particular recreated original data that is to be acquired for the second string. For example, the second string copy engine may compute, using the distance, a particular byte in an N-byte line in the scratch array or the history buffer from where reading the second string is to commence. The second string copy engine then, based on a length of the second string, reads one or more bytes for the second string in sequence from the scratch array and/or the history buffer starting from the location in the scratch array or history buffer. At the conclusion of this operation, the second string copy engine has a copy of the one or more bytes of the second string.

The second string copy engine then appends the second string to the recreated original data (step 812). For this operation, the second string copy engine writes the individual bytes of the second string, which is recreated original data, to locations in the scratch array. Note that one or more previous string copy commands and/or literal write commands may not have completed their respective writes to the string copy engine and thus the second string copy command may write data to bytes in the scratch array that are past the current end of the recreated original data in the scratch array. It can happen, however, that the second string copy engine simply adds the recreated original data to the end of existing recreated original data for the appending operation. In addition, when the second string is sufficiently long and/or the scratch array is already sufficiently full of previously recreated original data, the scratch array may migrate recreated original data to the history buffer in first-in-first-out order to free up one or more N-byte lines for the second string copy engine to continue to write recreated original data to the scratch array.

Figure 9:
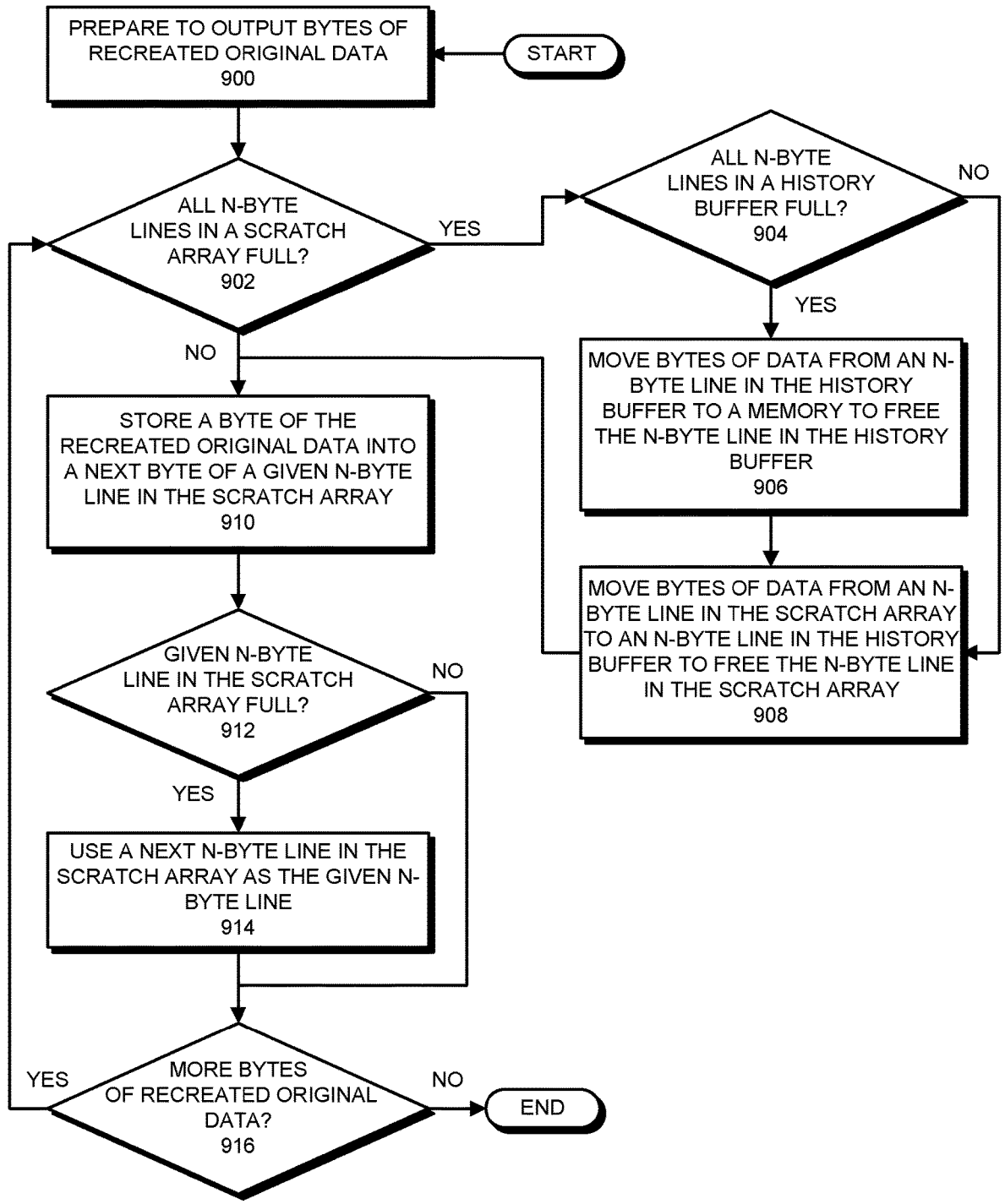
FIG. 9 presents a flowchart illustrating a process for storing recreated original data in a scratch array and history buffer in accordance with some embodiments.

Process for Handling Recreated Original Data in the Scratch Array and History Buffer In the described embodiments, a command buffer and string copy engines in a decompression subsystem write recreated original data, i.e., literals and strings, respectively, to a scratch array and a history buffer. As recreated original data is written to the scratch array and history buffer, the data proceeds or flows through the scratch array and history buffer to a memory. FIG. 9 presents a flowchart illustrating a process for storing recreated original data in a scratch array and history buffer in accordance with some embodiments. Note that the operations shown in FIG. 9 are presented as a general example of operations performed by some embodiments. The operations performed by other embodiments include different operations, operations that are performed in a different order, and/or operations that are performed by different entities or functional blocks.

For the example in FIG. 9, operations are performed for moving or migrating data in the scratch array and/or history buffer as a command buffer or a string copy engine prepares to output bytes of recreated original data. In some embodiments, however, the operations of FIG. 9 can be performed at any time. For example, in some embodiments, the operations of FIG. 9 are performed dynamically, as recreated original data is written into particular locations in the scratch array and/or the history buffer, recreated original data is moved from other locations to prepare the other locations to receive recreated original data. In this way, the scratch array and/or the history buffer are prepared to receive recreated original data "on the fly." Generally, in the described embodiments, locations are made available for storing bytes of recreated original data in the scratch array and/or the history buffer as necessary. In addition, for the example in FIG. 9, recreated original data is described as proceeding or flowing to a memory, but this is merely an example. In some embodiments, the recreated original data proceeds or flows to another destination, such as a processing subsystem, a network interface, an IO device, etc. Note that, as the compressed input data is decompressed, all recreated original data eventually proceeds or flows through the scratch array and history buffer to the memory (or to another entity), where the recreated original data is stored for other operations—and the scratch array and history buffer will eventually empty.

As can be seen in FIG. 9, the process starts when the command buffer or a string copy engine prepares to output bytes of recreated original data (step 900). For example, the command buffer may be appending a literal to the recreated original data or the string copy command may be appending a string to the recreated original data.

Before the recreated original data can be written to the scratch array and/or the history buffer, the decompression subsystem (e.g., a controller in or associated with the scratch array and or history buffer, etc.) ensures that there is sufficient space in the scratch array and/or history buffer to store the data. For this operation, the decompression subsystem determines if all of the N-byte lines in the scratch array are full (of previously recreated original data) (step 902). This can occur when previous literal write commands and/or string copy commands have caused the command buffer and/or the string copy engines to write sufficient data to the scratch array to fill the relatively small number of N-byte lines in the scratch array. When all the lines in the scratch array are full, the decompression subsystem determines if all the lines in the history buffer are full (step 904). When all the lines in the history buffer are full (step 904), the decompression subsystem moves or migrates bytes of data from one or more N-byte lines in the history buffer to the memory (e.g., memory 404) to free the one or more N-byte lines in the history buffer (step 906). The decompression subsystem moves or migrates bytes of data from one or more N-byte lines in the scratch array to one or more N-byte lines in the history buffer (step 908). At the conclusion of this operation, sufficient space is available in the scratch array and/or the history buffer to store the bytes of recreated original data.

The command buffer or a string copy engine then stores a byte of the recreated original data into a next byte of a given N-byte line in the scratch array (step 910). For this operation, the command buffer or a string copy engine stores the byte of the recreated original data in sequence into the given N-byte line in the scratch array (recall that all recreated original data from a previous string copy command and/or literal write command subsequent thereto may not yet be written into previous bytes of the N-byte line—and thus the recreated original data is written into the N-byte line "in sequence" from a particular location following one or more not-yet-valid bytes). If writing the byte to the given N-byte line in the scratch array fills the given N-byte line (step 912), i.e., if all the bytes in the given N-byte line are full, a next N-byte line in the scratch array is to be used as the given N-byte line (step 914). In other words, as a particular N-byte line in the scratch array fills up, subsequent bytes of recreated original data are to be written to a next N-byte line in the scratch array. If there are no more bytes to be appended to the recreated original data in the scratch array or history buffer (i.e., if all of the bytes of the recreated original data have been output by the command buffer or the string copy engine) (step 916), the process ends. Otherwise, if there are more bytes of recreated original data (step 916), the process returns to step 902, where the fullness of the scratch array and/or the history buffer are checked (steps 902-908) before the next byte is appended to the recreated original data (step 910).

Process for Checking Dependencies

Figure 10:
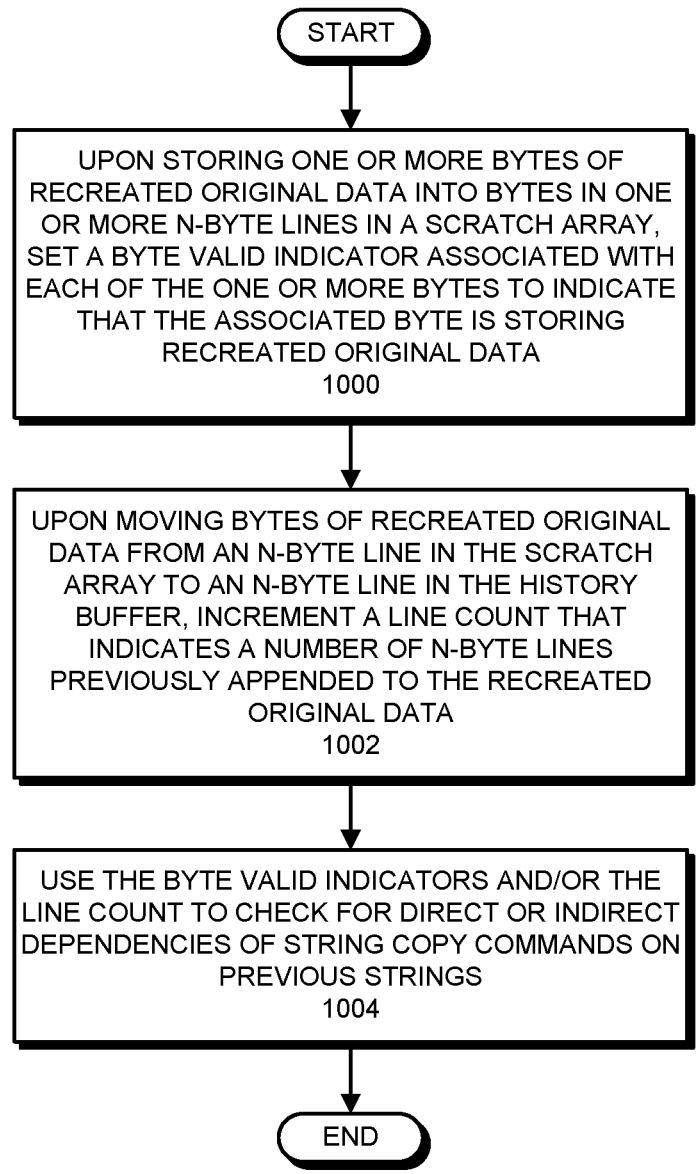
FIG. 10 presents a flowchart illustrating a process for checking for dependencies for string copy commands in accordance with some embodiments.

In the described embodiments, string copy commands are checked for dependencies on strings written to a scratch array and/or a history buffer by previous literal write commands and string copy commands. FIG. 10 presents a flowchart illustrating a process for checking for dependencies for string copy commands in accordance with some embodiments. Note that the operations shown in FIG. 10 are presented as a general example of operations performed by some embodiments. The operations performed by other embodiments include different operations, operations that are performed in a different order, and/or operations that are performed by different entities or functional blocks.

The process in FIG. 10 starts when functional blocks in a decompression subsystem maintain records used for determining dependencies. More specifically, upon storing one or more bytes of recreated original data into bytes in one or more N-byte lines in a scratch array, a byte valid tracker (e.g., byte valid tracker 634) sets a byte valid indicator (e.g., byte valid indicators 638) associated with each of the one or more bytes to indicate that the associated byte is storing recreated original data (step 1000). For this operation, the byte valid tracker sets, in a byte valid array (e.g., byte valid array 636), the byte valid indicators to a value such as 1 to indicate that the corresponding byte in the scratch array stores valid recreated original data. In addition, upon moving bytes of recreated original data from an N-byte line in the scratch array to an N-byte line in the history buffer, a line counter (e.g., line counter 630) increments a line count that indicates a number of N-byte lines previously appended to the recreated original data (step 1002). For this operation, as each N-byte line worth of recreated original data is migrated from the scratch array to the history buffer, the line counter increments the line count, thereby updating the line count to hold the number of N-byte lines present in the history buffer and the memory (for lines migrated to the memory from the history buffer).

The decompression subsystem then uses the records, i.e., the line count and the byte valid indicators, to determine whether an as-yet unresolved dependency exists for string copy commands. In other words, the string copy engines (or another entity) use the byte valid indicators and/or the line count to check for direct or indirect dependencies of string copy commands on previous strings of recreated original data (step 1004). For this operation, for a given string copy command, the string copy engine compares the distance and length for the string of previously recreated original data to be acquired with the value of the line count to determine whether an N-byte line that includes the needed data is present (or not) in the scratch array and/or the history buffer. When the line count shows that less recreated original data has been written to the scratch array and/or the history buffer than is needed (and thus the N-byte line is not yet present in the scratch array and/or the history buffer), the string copy engine detects an as-yet unresolved dependency. In addition, when the byte indicators show that the bytes of recreated original data needed for the string copy command are not yet present in the scratch array, the string copy engine detects an as-yet unresolved dependency. As described above, upon detecting an as-yet unresolved dependency, the string copy engine stalls processing the string copy command to enable the needed recreated original data to be written to the scratch array and/or the history buffer. In some embodiments, the stall is for a specified time, until the particular bytes are detected as being present (e.g., by periodically rechecking the byte valid indicators and/or the line count, etc.), until the previous literal write command and/or string copy command are retired, etc.

In some embodiments, at least one electronic device (e.g., electronic device 400) uses code and/or data stored on a non-transitory computer-readable storage medium to perform some or all of the operations herein described. More specifically, the at least one electronic device reads code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., eDRAM, RAM, SRAM, DRAM, DDR4 SDRAM, etc.), non-volatile RAM (e.g., phase change memory, ferroelectric random access memory, spin-transfer torque random access memory, magnetoresistive random access memory, etc.), read-only memory (ROM), and/or magnetic or optical storage mediums (e.g., disk drives, magnetic tape, CDs, DVDs, etc.).

In some embodiments, one or more hardware modules perform the operations herein described. For example, the hardware modules can include, but are not limited to, one or more processors/cores/central processing units (CPUs), application-specific integrated circuit (ASIC) chips, neural network processors or accelerators, field-programmable gate arrays (FPGAs), decompression and/or decoding subsystems, compute units, embedded processors, graphics processors (GPUs)/graphics cores, pipelines, accelerated processing units (APUs), functional blocks, controllers, accelerators, and/or other programmable-logic devices. When such hardware modules are activated, the hardware modules perform some or all of the operations. In some embodiments, the hardware modules include one or more general purpose circuits that are configured by executing instructions (program code, firmware, etc.) to perform the operations.

In some embodiments, a data structure representative of some or all of the structures and mechanisms described herein (e.g., electronic device 400 or some portion thereof) is stored on a non-transitory computer-readable storage medium that includes a database or other data structure which can be read by an electronic device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N, M, and X As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device for decompressing compressed data to recreate original data from which the compressed data was generated, the electronic device comprising:
   a first string copy engine that processes a first string copy command by:
      acquiring a first string from recreated original data; and
      appending the first string to the recreated original data; and
   a second string copy engine that processes a second string copy command by:
      checking the second string copy command for a direct dependency on the first string, a direct dependency occurring when the second string copy command is to acquire bytes from the first string, and, when the direct dependency is found, stalling further processing of the second string copy command until the first string copy engine has appended a corresponding portion of the first string to the recreated original data;
      acquiring a second string from the recreated original data; and
      appending the second string to the recreated original data.

2. The electronic device of claim 1, wherein, when processing the second string copy command, the second string copy engine further:
   checks the second string copy command for an indirect dependency on the first string, an indirect dependency occurring when the second string copy command is to acquire one or more bytes from literals appended to the recreated original data based on literal write commands that intervene between the first string copy command and the second string copy command, and, when the indirect dependency is found, stalls further processing of the second string copy command until the literals are appended to the recreated original data.

3. The electronic device of claim 1, further comprising:
   a scratch array that includes sequential logic storage elements for storing X separate N-byte lines of recreated original data; and
   a history buffer that includes memory elements for storing Y separate N-byte lines of recreated original data, where Y and X are numbers with Y being greater than X.

4. The electronic device of claim 3, wherein appending a given string to the recreated original data includes:
   when the X N-byte lines in the scratch array are full, moving previously recreated original data in first-in-first-out order from one or more N-byte lines in the scratch array to one or more N-byte lines in the history buffer to free up the one or more N-byte lines in the scratch array for storing bytes of recreated original data from the given string; and
   storing bytes from the given string in sequence into bytes in the one or more N-byte lines in the scratch array.

5. The electronic device of claim 4, further comprising:
   a memory;
   wherein appending the given string to the recreated original data includes:
      when the Y N-byte lines in the history buffer are full, moving previously recreated original data in first-in-first-out order from one or more N-byte lines in the history buffer to the memory to free up the one or more N-byte lines in the history buffer for storing bytes of recreated original data that are moved to the history buffer from the scratch array.

6. The electronic device of claim 4, further comprising:
   a line counter that stores a line count, the line count indicating a number of N-byte lines previously appended to the recreated original data, wherein, when an N-byte line is moved from the scratch array to the history buffer, the line counter increments the line count; and
   a byte valid tracker that stores byte valid indicators, wherein the byte valid indicators include a byte valid indicator for each byte in the X N-byte lines in the scratch array, each byte valid indicator indicating whether a corresponding byte in the scratch array currently stores valid recreated original data, wherein the byte valid tracker sets byte valid indicators upon storing bytes of recreated original data into the corresponding bytes in the scratch array and clears byte valid indicators upon moving bytes of recreated original data from the corresponding bytes in the scratch array to the history buffer.

7. The electronic device of claim 6, wherein, when checking the second string copy command for the direct dependency on the first string, the second string copy engine:
   acquires, from the second string copy command, a distance and a string length; and
   determines, using the distance, the string length, and one or both of the line count and the byte valid indicators whether the second string copy command has the direct dependency on the first string.

8. The electronic device of claim 3, wherein acquiring a given string from the recreated original data when processing a string copy command includes:
   using a distance from the string copy command to determine a location in the scratch array or the history buffer;
   using a string length from the string copy command to determine a number of bytes of recreated original data to be read from the scratch array and/or the history buffer; and
   starting from the location in the scratch array or the history buffer, reading the number of bytes of the recreated original data in sequence from the scratch array and/or the history buffer.

9. The electronic device of claim 3, wherein:
   the sequential logic storage elements in the scratch array include flip flops and/or latches; and
   the memory elements in the history buffer include static random access (SRAM) memory elements.

10. The electronic device of claim 1, further comprising:
    a command processor that:
      receives a literal write command;
      acquires a literal value identified in the literal write command; and
      appends the literal value to the recreated original data, the appending comprising:
        storing the literal value into one or more specified bytes in one or more N-byte lines in the scratch array, the storing comprising, when all of the X N-byte lines in the scratch array are full, moving bytes of recreated original data from scratch array to the history buffer to free up the one or more N-byte lines in the scratch array.

11. The electronic device of claim 1, further comprising:
    at least one command generator that receives string copy commands and forwards the string copy commands to the first string copy engine and the second string copy engine for processing thereby in a round-robin fashion.

12. The electronic device of claim 1, further comprising:
    at least one command generator that receives string copy commands and forwards the string copy commands to the first string copy engine and the second string copy engine for processing thereby as each of the first string copy engine and the second string copy engine become available for processing string copy commands.

13. A method for decompressing compressed data to recreate original data from which the compressed data was generated in an electronic device that includes a first string copy engine and a second string copy engine, the method comprising:
    processing, by the first string copy engine, a first string copy command by:
      acquiring a first string from recreated original data; and
      appending the first string to the recreated original data; and
    processing, by the second string copy engine, a second string copy command by:
      checking the second string copy command for a direct dependency on the first string, a direct dependency occurring when the second string copy command is to acquire bytes from the first string, and, when the direct dependency is found, stalling further processing of the second string copy command until the first string copy engine has appended a corresponding portion of the first string to the recreated original data;
      acquiring a second string from the recreated original data; and
      appending the second string to the recreated original data.

14. The method of claim 13, wherein, processing, by the second string copy engine, the second string copy command comprises:
    checking the second string copy command for an indirect dependency on the first string, an indirect dependency occurring when the second string copy command is to acquire one or more bytes from literals appended to the recreated original data based on literal write commands that intervene between the first string copy command and the second string copy command, and, when the indirect dependency is found, stalling further processing of the second string copy command until the literals are appended to the recreated original data.

15. The method of claim 13, wherein:
    the electronic device includes a scratch array that includes sequential logic storage elements for storing X separate N-byte lines of recreated original data and a history buffer that includes memory elements for storing Y separate N-byte lines of recreated original data, where Y and X are numbers with Y being greater than X; and
    appending a given string to the recreated original data includes:
      when the X N-byte lines in the scratch array are full, moving previously recreated original data in first-in-first-out order from one or more N-byte lines in the scratch array to one or more N-byte lines in the history buffer to free up the one or more N-byte lines in the scratch array for storing bytes of recreated original data from the given string; and
      storing bytes from the given string in sequence into bytes in the one or more N-byte lines in the scratch array.

16. The method of claim 15, wherein:
    the electronic device includes a memory; and
    appending a given string to the recreated original data includes:
      when the Y N-byte lines in the history buffer are full, moving previously recreated original data in first-in-first-out order from one or more N-byte lines in the history buffer to the memory to free up the one or more N-byte lines in the history buffer for storing bytes of recreated original data that are moved to the history buffer from the scratch array.

17. The method of claim 15, wherein:
    the electronic device includes:
      a line counter that stores a line count, the line count indicating a number of N-byte lines previously appended to the recreated original data; and
      a byte valid tracker that stores byte valid indicators, the byte valid indicators including a byte valid indicator for each byte in the X N-byte lines in the scratch array, each byte valid indicator indicating whether a corresponding byte in the scratch array currently stores valid recreated original data;
    the method further comprises:
      incrementing, by the line counter, the line count when an N-byte line is moved from the scratch array to the history buffer;
      setting, by the byte valid tracker, byte valid indicators upon storing bytes of recreated original data into the corresponding bytes in the scratch array; and clearing, by the byte valid tracker, byte valid indicators upon moving bytes of recreated original data from the corresponding bytes in the scratch array to the history buffer.

18. The method of claim 17, wherein checking the second string copy command for the direct dependency on the first string includes:
acquiring, by the second string copy engine, from the second string copy command, a distance and a string length; and
determining, by the second string copy engine, using the distance, the string length, and one or both of the line count and the byte valid indicators whether the second string copy command has the direct dependency on the first string.

19. The method of claim 13, wherein:
the electronic device includes a scratch array that includes sequential logic storage elements for storing X separate N-byte lines of recreated original data and a history buffer that includes memory elements for storing Y separate N-byte lines of recreated original data, where Y and X are numbers with Y being greater than X; and
acquiring a given string from the recreated original data when processing a string copy command includes:
using a distance from the string copy command to determine a location in the scratch array or the history buffer;
using a string length from the string copy command to determine a number of bytes of recreated original data to be read from the scratch array and/or the history buffer; and
starting from the location in the scratch array or the history buffer, reading the number of bytes of the recreated original data in sequence from the scratch array and/or the history buffer.

20. The method of claim 13, wherein:
the electronic device includes a scratch array that includes sequential logic storage elements for storing X separate N-byte lines of recreated original data and a history buffer that includes memory elements for storing Y separate N-byte lines of recreated original data, where Y and X are numbers with Y being greater than X;
the sequential logic storage elements in the scratch array include flip flops and/or latches; and
the memory elements in the history buffer include static random access (SRAM) memory elements.

21. The method of claim 13, wherein:
the electronic device includes a command processor, a scratch array that includes sequential logic storage elements for storing X separate N-byte lines of recreated original data, and a history buffer that includes memory elements for storing Y separate N-byte lines of recreated original data, where Y and X are numbers with Y being greater than X;
the method further comprises:
receiving, by the command processor, a literal write command;
acquiring, by the command processor, a literal value identified in the literal write command; and
appending, by the command processor, the literal value to the recreated original data, the appending including:
storing the literal value into one or more specified bytes in one or more N-byte lines in the scratch array, the storing comprising, when all of the X N-byte lines in the scratch array are full, moving bytes of recreated original data from scratch array to the history buffer to free up the one or more N-byte lines in the scratch array.

* * * * *